US010232715B2

(12) United States Patent
Kawashima et al.

(10) Patent No.: US 10,232,715 B2
(45) Date of Patent: Mar. 19, 2019

(54) VEHICLE CONTROL APPARATUS FOR HYBRID VEHICLES

(71) Applicant: Nissan Motor Co., Ltd., Yokohama-shi, Kanagawa (JP)

(72) Inventors: Hideki Kawashima, Kanagawa (JP); Mitsuru Uehara, Kanagawa (JP); Jun Nakanowatari, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 15/555,987

(22) PCT Filed: Mar. 20, 2015

(86) PCT No.: PCT/JP2015/058402
§ 371 (c)(1),
(2) Date: Sep. 6, 2017

(87) PCT Pub. No.: WO2016/151658
PCT Pub. Date: Sep. 29, 2016

(65) Prior Publication Data
US 2018/0079310 A1 Mar. 22, 2018

(51) Int. Cl.
*B60L 3/00* (2019.01)
*B60W 20/40* (2016.01)
*B60W 20/50* (2016.01)
*B60W 10/08* (2006.01)
*B60W 10/30* (2006.01)
(Continued)

(52) U.S. Cl.
CPC ............... *B60L 3/0069* (2013.01); *B60K 6/48* (2013.01); *B60L 3/04* (2013.01); *B60W 10/06* (2013.01); *B60W 10/08* (2013.01); *B60W 10/30* (2013.01); *B60W 20/00* (2013.01); *B60W 20/10* (2013.01); *B60W 20/40* (2013.01); *B60W 20/50* (2013.01);
(Continued)

(58) Field of Classification Search
None
See application file for complete search history.

(56) References Cited

U.S. PATENT DOCUMENTS

2006/0180362 A1* 8/2006 Yamaguchi ............ B60K 6/445
180/65.235
2007/0241758 A1* 10/2007 Kamata ................. B60L 3/0023
324/537

(Continued)

FOREIGN PATENT DOCUMENTS

CN 101161499 A 4/2008
CN 103576042 A 2/2014
(Continued)

*Primary Examiner* — Abby Y Lin
*Assistant Examiner* — Kyung J Kim
(74) *Attorney, Agent, or Firm* — Global IP Counselors, LLP

(57) ABSTRACT

A vehicle control device is provided for hybrid vehicles with which it is possible to improve the detection accuracy of an electric leakage. The vehicle control device determines an occurrence of an electric leakage of a strong current system that is routed from a high power battery to a motor. The vehicle control device includes an integrated controller that executes a process that prohibits a mode switch between an HEV mode for traveling by the drive force of the engine and the motor, and an EV mode for traveling by the drive force of only the motor during an electric leakage detection.

10 Claims, 9 Drawing Sheets

(51) Int. Cl.
*B60L 3/04* (2006.01)
*B60K 6/48* (2007.10)
*B60W 10/06* (2006.01)
*B60W 20/00* (2016.01)
*B60W 50/02* (2012.01)
*G01R 31/02* (2006.01)
*B60W 20/10* (2016.01)
*B60W 50/029* (2012.01)

(52) U.S. Cl.
CPC ....... *B60W 50/0205* (2013.01); *G01R 31/025* (2013.01); *B60W 2050/021* (2013.01); *B60W 2050/0295* (2013.01); *B60W 2510/08* (2013.01); *B60W 2510/305* (2013.01); *B60W 2710/08* (2013.01); *B60W 2710/305* (2013.01); *Y02T 10/6221* (2013.01); *Y02T 10/6286* (2013.01); *Y10S 903/902* (2013.01)

(56) References Cited

U.S. PATENT DOCUMENTS

| | | |
|---|---|---|
| 2010/0063660 A1 | 3/2010 | Uchida |
| 2011/0057660 A1 | 3/2011 | Kagoshima |
| 2012/0109435 A1 | 5/2012 | Mikulec et al. |
| 2014/0039740 A1 | 2/2014 | Kwon et al. |

FOREIGN PATENT DOCUMENTS

| | | |
|---|---|---|
| CN | 104395574 A | 3/2015 |
| JP | 2001-25103 A | 1/2001 |
| JP | 2008-154426 A | 7/2008 |
| JP | 2008-167617 A | 7/2008 |
| JP | 2011-058839 A | 3/2011 |
| JP | 2012-135124 A | 7/2012 |
| JP | 2012-144219 A | 8/2012 |

\* cited by examiner

VEHICLE CONTROL APPARATUS FOR HYBRID VEHICLES

CROSS-REFERENCE TO RELATED APPLICATIONS

This application is a U.S. National stage application of International Application No. PCT/JP2015/058402, filed Mar. 20, 2015.

BACKGROUND

Field of the Invention

The present invention relates to a vehicle control device for hybrid vehicles.

Background Information

Conventionally, an electric vehicle that uses a motor as a drive source is known, in which electric leakage is detected from a decrease in the insulation resistance between the motor and a ground, and the motor is controlled according the insulation state with the ground, in preparation for an electric leakage in a motor, which is supplied with electricity from a high power battery (for example refer to Japanese Laid-Open Patent Application No. 2008-154426-Patent Document 1). In this prior art, the torque of the motor is limited when the insulation resistance falls below a reference value.

SUMMARY

However, in the prior art described above, in a vehicle having an engine and a motor as drive sources, the fact that the insulation resistance of the heavy current system, which is routed from the high power battery, fluctuates due to switching between the HEV mode and the EV mode, is not considered. That is, in the prior art described above, when the mode is switched, as described above, while an electric leakage is being determined, there are cases in which the insulation resistance fluctuates, and an electric leakage is erroneously detected.

In view of the problem described above, an object of the present invention is to provide a vehicle control device for hybrid vehicles that is capable of improving the detection accuracy of electric leakages.

In order to achieve the above-described object, the vehicle control device for hybrid vehicles of the present invention comprises a power source provided with an engine and a motor, a high power battery that supplies power to the motor, and an electric leakage detection means that detects an occurrence of electric leakage of a strong current system that is routed from the high power battery to the motor. This vehicle control device for hybrid vehicles is provided with a mode controller and prohibits a mode switch between the HEV mode and the EV mode when the electric leakage detection means is detecting an electric leakage.

In the vehicle control device for hybrid vehicles according to the present invention, the mode controller prohibits switching between the HEV mode and the EV mode while an electric leakage is being detected. Therefore, in the present invention, it is possible to suppress fluctuation of the insulation resistance due to mode switching, to thereby prevent an erroneous detection of an electric leakage.

BRIEF DESCRIPTION OF THE DRAWINGS

Referring now to the drawings, an electrical leakage detection device for hybrid vehicles is illustrated.

DETAILED DESCRIPTION OF THE EMBODIMENTS

Figure 1:
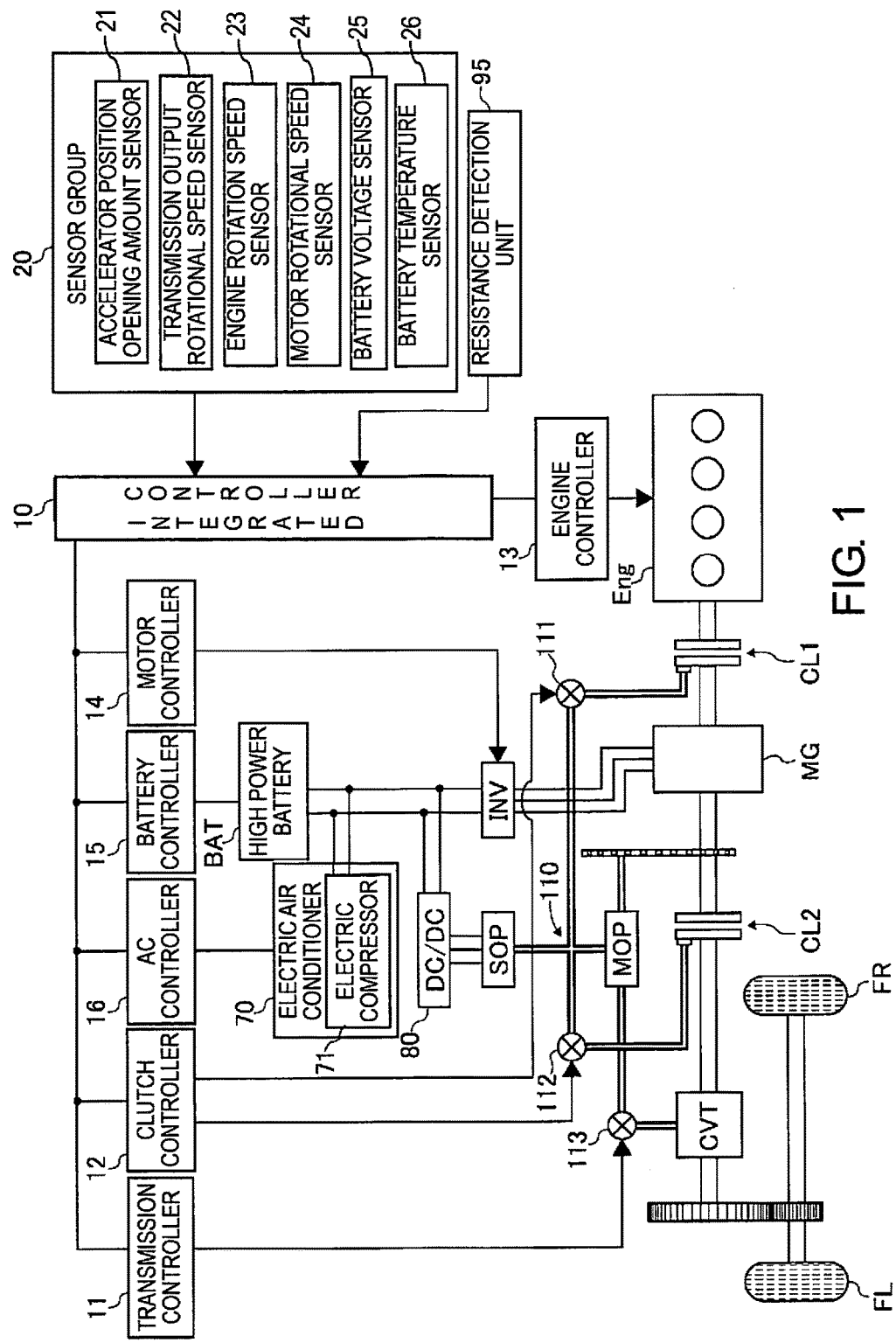
FIG. 1 is an overall system schematic diagram illustrating an overall configuration of a hybrid vehicle provided with the electrical leakage detection device according to a first embodiment.

A preferred embodiment for realizing a vehicle control device for a hybrid vehicle of the present invention is described below based on the embodiments illustrated in the drawings.

First Embodiment

First, the configuration of the vehicle control device for a hybrid vehicle of a first embodiment will be described. The vehicle control device for hybrid vehicles according to the first embodiment is applied to an FF hybrid vehicle (hereinafter simply referred to as hybrid vehicle), having left and right front wheels as the drive wheels, and equipped with a belt type continuously variable transmission as the transmission. The "overall system configuration of a hybrid vehicle", the "control system of the hybrid vehicle", (control by the integrated controller), (configuration of the strong current system), and (electric leakage determination control) will be separately described below, regarding the configuration of the vehicle control device for hybrid vehicles according to the first embodiment.

Overall System Configuration of a Hybrid Vehicle

FIG. 1 is an overall system schematic diagram of the hybrid vehicle to which is applied the vehicle control device of the first embodiment. The overall system configuration of the hybrid vehicle will be described below, based on FIG. 1.

A drive system of a hybrid vehicle is provided with an engine Eng, a first clutch CL1, a motor-generator MG (hereinafter referred to as motor MG), a second clutch CL2, and a continuously variable transmission CVT.

That is, the drive system of the hybrid vehicle is configured so that it is possible for the outputs of the engine Eng and the motor MG as drive sources to be shifted to a predetermined transmission ratio by the continuously variable transmission CVT, and transmitted to the left and right front wheels FL, FR as the drive wheels.

Additionally, in this drive system of the hybrid vehicle, a first clutch CL1 that is able to connect/disconnect the drive transmission is provided between the engine Eng and the motor MG, and a second clutch CL2 that is able to connect/disconnect the drive transmission is provided between the motor MG and the continuously variable transmission CVT. It is thereby possible to form an HEV traveling mode in which both clutches CL1, CL2 are engaged, and traveling is carried out by the drive force of the engine Eng and the motor MG. In addition, it is possible to form an EV mode in which the first clutch CL1 is released and the second clutch CL2 is engaged, and traveling is carried out by the drive force of only the motor MG.

The engine Eng is capable of lean combustion, and the engine torque is controlled to match the command value by controlling the intake air amount by a throttle actuator, the fuel injection amount by an injector, and the ignition timing by a spark plug.

The engine Eng can be started by cranking with the motor MG, while the first clutch CL1 is slip-engaged. In addition, the configuration can be such that it is possible to start with a starter motor, which is not shown, under low-temperature conditions or high-temperature conditions, etc.

The first clutch CL1 is a frictional engagement element that is interposed between the engine Eng and the motor MG. A clutch that is able to switch between full engagement, half engagement, and disengagement by a stroke control based on a first clutch hydraulic pressure that is supplied from a hydraulic pressure control circuit 110, described later, is used as the first clutch CL1.

The motor MG has an AC synchronous motor structure that serves as a travel drive source, and is for carrying out drive torque control and rotational speed control when starting and traveling, as well as for recovering the vehicle kinetic energy generated by the regenerative braking control to the high power battery BAT when braking and decelerating. An inverter INV, which converts direct current to three-phase alternating current during powering and converts three-phase alternating current to direct current during regeneration, is interposed between the motor MG and the high power battery BAT.

The second clutch CL2 is a frictional engagement element that is interposed between the motor MG and left and right front wheels FL, FR, which are the drive wheels. This second clutch CL2 is also controlled to be in full engagement/slip engagement/disengagement by a stroke control according to a second clutch hydraulic pressure that is supplied from the hydraulic pressure control circuit 110.

The continuously variable transmission CVT is well-known comprising, although not shown, a primary pulley, a secondary pulley, and a belt that is wound around both pulleys. Furthermore, the CVT achieves a stepless transmission ratio by changing the winding diameter of the belt, by a primary pressure and a secondary pressure that are supplied from the hydraulic pressure control circuit 110 to a primary oil chamber and a secondary oil chamber.

The hydraulic pressure control circuit 110 comprises, as hydraulic power sources, a main oil pump MOP (mechanical drive) and a sub oil pump SOP (motor drive). The main oil pump MOP is rotationally driven by a motor shaft of the motor MG (=transmission input shaft). In addition, the sub oil pump SOP is driven by a built-in motor, and is mainly used as an auxiliary pump for producing lubrication and cooling oil. The sub oil pump SOP is driven by power supplied from a DC/DC converter 80, described later.

The hydraulic pressure control circuit 110 comprises a first clutch solenoid valve 111, a second clutch solenoid valve 112, and a transmission control solenoid valve 113. The first clutch solenoid valve 111 and the second clutch solenoid valve 112 use line pressure PL that is generated by adjusting the pump discharge pressure from the hydraulic power source as the source pressure, and respectively form a first clutch pressure and a second clutch pressure based on the stroke amount thereof. The transmission control solenoid valve 113 uses line pressure PL as the source pressure to create a primary pressure and a secondary pressure according to the stroke amount thereof, and is configured from a plurality of solenoid valves.

As described above, a hybrid vehicle comprises an "EV mode," an "HEV mode," and an "(HEV) WSC mode" as main driving modes, and a hybrid drive system called one-motor two-clutch is configured thereby.

The "EV mode" is an electric vehicle mode that has only the motor MG as the drive source by releasing the first clutch CL1 and engaging the second clutch CL2. The "HEV mode" is a hybrid vehicle mode that has the engine Eng and the motor MG as drive sources, by engaging both clutches CL1, CL2. The "WSC mode" is a CL2 slip engagement mode in which the rotational speed of the motor MG is controlled in the "HEV mode," and the second clutch CL2 is slip-engaged with an engagement torque capacity corresponding to a required driving force. This "WSC mode" is selected according to the CL2 slip engagement to absorb the rotational difference between the left and right front wheels FL, FR and the engine Eng that is rotated at equal to or greater than the engine idle rotational speed, in the stopped to the starting regions, or the low-speed to the stopped regions, while in the "HEV mode." The reason why the "WSC mode" is necessary is because the drive system does not have a rotational difference absorption joint, such as a torque converter.

Control System of the Hybrid Vehicle

The control system of the hybrid vehicle will be described next. The control system of the hybrid vehicle comprises an inverter INV, a high power battery BAT, an integrated controller 10 (mode controller), a transmission controller 11, a clutch controller 12, an engine controller 13, a motor controller 14, a battery controller 15, and an AC controller 16. In the present embodiment, the control system is configured to comprise various controllers individually; however, the control system may be configured to be integrated into one controller.

The power supply system of the hybrid vehicle comprises a high power battery BAT as a motor-generator power supply, and a 12 V battery (not shown) as a 12 V load power supply.

The inverter INV carries out DC/AC conversion, and generates a drive current for the motor MG. The inverter also reverses the output rotation of the motor MG, by reversing the phase of the generated drive current. The high power battery BAT is a secondary battery that is mounted as a power source of the motor-generator MG and, for example, a lithium ion battery, in which a cell module configured from numerous cells is set inside a battery pack case, is used therefor. In the present embodiment, the high power battery is not limited to a lithium ion battery and may be a power storage means such as a nickel hydrogen battery. Additionally, the high power battery BAT is provided with a service disconnect switch SDSW that cuts off the output of the high-voltage DC voltage from the battery system 4, in order to ensure safety during vehicle maintenance, or the like.

The inverter INV converts the DC power from the high power battery BAT to a three-phase alternating current and supplies the same to the motor MG, at the time of powering, in which the motor MG is driven by the discharge of the high power battery BAT, by a powering/regeneration control by the motor controller 14. In addition, the inverter converts the three-phase AC power from the motor MG to DC power, at the time of regeneration for charging the high power battery BAT, by the power generation by the motor MG.

The integrated controller 10 is configured from an electronic control unit (ECU) that is provided with a microcomputer, and calculates a target drive torque, and the like, from the remaining battery capacity (battery SOC), the accelerator position opening amount APO, the vehicle speed VSP, and the like. Then, based on the calculation result, the integrated controller 10 calculates command values for each of the actuators (motor MG, engine Eng, first clutch CL1, second clutch CL2, continuously variable transmission CVT), which are then transmitted to the respective controllers 11-15.

The battery SOC is input from the battery controller 15. The accelerator position opening amount APO is detected by an accelerator position opening amount sensor 21. The vehicle speed VSP is a value that is synchronized with the transmission output rotational speed, and is detected by a transmission output rotational speed sensor 22. In addition, this integrated controller 10 controls the discharge flow rate of the main oil pump MOP, the discharge flow rate of the sub oil pump SOP, and the line pressure PL.

The transmission controller 11 performs a shift control so as to achieve a gear shift command from the integrated controller 10. This shift control is carried out by controlling the hydraulic pressure supplied to the primary pulley and the hydraulic pressure supplied to the secondary pulley of the continuously variable transmission CVT, based on the control of the transmission control solenoid valve 113, using the line pressure PL that is supplied via the hydraulic pressure control circuit 110 as the source pressure. Then, the surplus pressure, which is generated when creating the hydraulic pressure supplied to the primary pulley and the hydraulic pressure supplied to the secondary pulley from the line pressure PL, is passed onto cooling and lubricating the first clutch CL1 and the second clutch CL2.

The clutch controller 12 inputs a clutch input and output rotational speed, a second clutch output rotational speed, a clutch oil temperature, and the like, and carries out a first clutch control and a second clutch control, so as to achieve the first clutch control command and the second clutch control command from the integrated controller 10.

This first clutch control is carried out by controlling the hydraulic pressure supplied to the first clutch CL1 based on the control of the first clutch solenoid valve 111, using the line pressure PL supplied via the hydraulic pressure control circuit 110 as the source pressure.

In addition, the second clutch control is carried out by controlling the hydraulic pressure supplied to the second clutch CL2 based on the control of the second clutch solenoid valve 112, using the line pressure PL supplied via the hydraulic pressure control circuit 110 as the source pressure. Then, the surplus pressure, which is generated when creating the hydraulic pressure that is supplied to the first clutch CL1 and the hydraulic pressure that is supplied to the second clutch CL2 from the line pressure PL, is passed onto cooling and lubricating the first clutch CL1 and the second clutch CL2.

The engine controller 13 inputs the engine rotational speed detected by the engine rotation speed sensor 23, target engine torque commands from the integrated controller 10, and the like. Then, the engine controller 13 carries out the start control, fuel injection control, ignition control, fuel cut control, and the like, in order to control the engine torque so as to achieve the target engine torque command value.

The motor controller 14 inputs target motor torque command values and motor rotational speed command values from the integrated controller 10, the motor rotational speed that is detected by the motor rotational speed sensor 24, and the like. Then, the motor controller 14 carries out controls such as the powering control and the regenerative control, motor creep control, and motor idle control of the motor MG, so as to achieve the target motor torque command value and the motor rotational speed command value.

The battery controller 15 manages the battery temperature, the battery SOC, which is the remaining capacity of the high power battery BAT and the like, based on the input information from a battery voltage sensor 25, a battery temperature sensor 26, and the like, and transmits the information to the integrated controller 10.

The AC controller 16 controls the operation of an electric air conditioner 70, based on a sensor (not shown) that detects various environmental factors that relate to the cabin temperature. The electric air conditioner 70 is operated by a power supply from the high power battery BAT to adjust the temperature inside the vehicle, and an electric compressor 71 that compresses a refrigerant is provided to the electric air conditioner 70. The electric compressor 71 incorporates an inverter inv2 (refer to FIG. 3), converts DC power supplied from the high power battery BAT to AC power, and is driven by a motor 71m (refer to FIG. 3). A DC/DC converter 80 is connected to the high power battery BAT in parallel with the electric air conditioner 70. The DC/DC converter 80 supplies DC power to on-board electric devices, such as the sub oil pump SOP, after transforming the voltage of the high power battery BAT.

Control by the Integrated Controller

Figure 2:
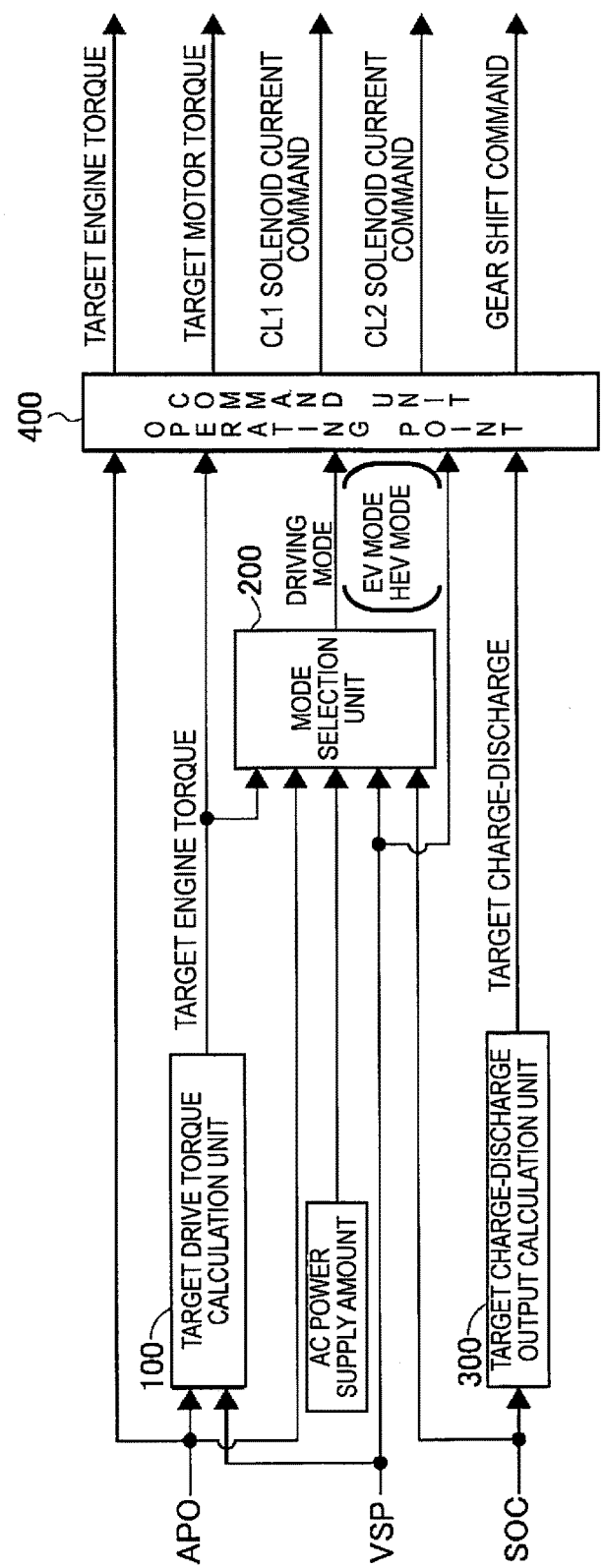
FIG. 2 is a block diagram illustrating a configuration of an integrated controller of the vehicle control device for hybrid vehicles according to the first embodiment.

Control by the integrated controller 10 will be briefly described next. The integrated controller 10 comprises a target drive torque calculation unit 100, a mode selection unit 200, a target charge/discharge output calculation unit 300, and an operating point command unit 400, as illustrated in FIG. 2.

In the target drive torque calculation unit 100, the accelerator position opening amount APO, the vehicle speed VSP, etc., are input, and a target drive torque tTd (target vehicle total torque) is calculated from a target stationary torque map (one example of an engine torque map), and an assist torque map (one example of a motor-generator torque map).

The mode selection unit 200 calculates which driving mode to be the target driving mode, that is, the HEV mode or the EV mode. The setting of the driving mode by the mode selection unit 200 can be, for example, selecting between the EV mode and the HEV mode according to the vehicle speed VSP and the accelerator position opening amount APO based on a mode selection map that is set in advance; however, the details are omitted.

The target charge/discharge output calculation unit 300 increases the power generation amount when the battery SOC is low, reduces the power generation amount when the battery SOC is high, and calculates the target charge/discharge power tP so as to increase the motor assistance.

The operating point command unit 400 calculates the operating point arrival targets from the accelerator position opening amount APO, the target drive torque tTd, the driving mode, the vehicle speed VSP, and the target charge/discharge power tP, which are output as command values. A target engine torque, a target motor torque, a target CL2 torque capacity, a target transmission ratio, a first clutch solenoid current command, and a second clutch solenoid current command, are calculated as these operating point arrival targets. In the present embodiment, the operating point command unit integrally calculates the target engine torque, the target motor torque, the target CL2 torque capacity, the target transmission ratio, the first clutch solenoid current command, and the second clutch solenoid current command; however, a means to calculate the command values can be provided for each.

Configuration of the Strong Current System

The integrated controller 10 further executed an electric leakage determination control of the strong current system 90 connected to the high power battery BAT. Here, in explaining the electric leakage determination control, the configuration of the strong current system 90, which is the object of the electric leakage determination, will be described first.

Figure 3:
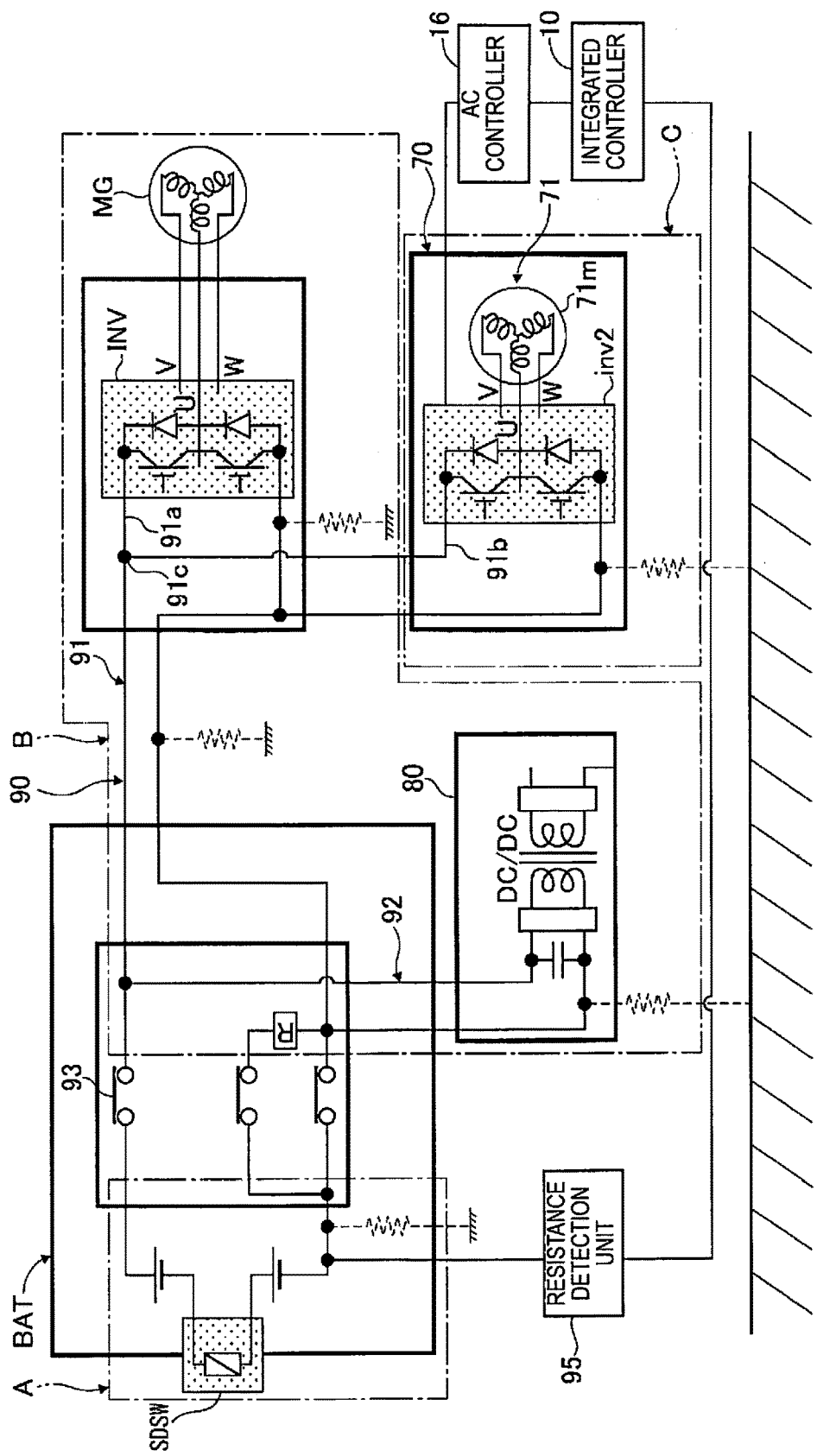
FIG. 3 is a schematic circuit diagram illustrating a strong current system in the vehicle control device for hybrid vehicles according to the first embodiment.

FIG. 3 is a circuit diagram illustrating the strong current system 90; the strong current system 90 supplies electric power from the high power battery BAT to the motor MG, the electric air conditioner 70, and the DC/DC converter 80. The wiring that carries out this power supply comprises a first strong current system 91 connected to the motor MG and an electric compressor 71, and a second strong current system 92 connected to the DC/DC converter 80, as illustrated in FIG. 3. In addition, the first strong current system 91 is split, at a branch part 91*c*, into a motor branch line part 91*a* connected to an inverter INV interposed between the motor MG and the branch part, and an air conditioner branch line part 91*b* connected to an inverter inv2, which is built into the electric compressor 71.

Furthermore, a strong current relay switch 93 is provided in the middle of the strong current system 90. The strong current relay switch 93 is disposed inside the high power battery BAT and serves as both a motor connection and disconnection part and as an air conditioner connection and disconnection part, to connect/disconnect the power supply between the high power battery BAT, and the motor MG, as well as the electric air conditioner 70. Furthermore, the strong current relay switch 93 also connects and disconnects the power supply between the high power battery BAT and the DC/DC converter 80.

The resistance detection unit 95 is connected to the high power battery BAT side of the strong current relay switch 93 of the strong current system 90, and detects the insulation resistance of the strong current system 90 (the floating resistance between the ground and the strong current system 90, indicated by the dotted line in the figure). The resistance detection unit 95 is connected to the low-potential side system of the high power battery BAT, but may be connected to the high-potential side system as well, and may be connected to any portion from which it is possible to detect the insulation resistance value of the strong current system.

In addition, the strong current system 90 is separated into three regions: a relay switch upstream region A; a relay switch downstream region B; and an air conditioner region C. The relay switch upstream region A is a region on the upstream (high power battery BAT) side of the strong current relay switch 93 in the strong current system 90. Additionally, the air conditioner region C is a region including the electric air conditioner 70 in the air conditioner branch line part 91*b* of the first strong current system 91. In addition, the relay switch downstream region B is a region excluding the air conditioner region C in the downstream side region of the strong current relay switch 93 of the strong current system 90.

Electric Leakage Determination Control

Next, the electric leakage determination control that is executed by the integrated controller 10 based on the detection of the resistance detection unit 95 will be described, based on the flowchart of FIG. 4. This electric leakage determination control is executed when in a READY-ON state, in which it is possible to travel with the ignition switch, which is not shown, turned ON.

First, in step S101, it is determined whether or not a state in which the insulation resistance, which is detected by the resistance detection unit 95, is less than a preset electric leakage determination threshold, has continued in excess of a first determination time than1. If a state in which the insulation resistance is less than the electric leakage determination threshold has continued in excess of the first determination time than1, the process proceeds to step S102, and if the insulation resistance is equal to, or greater than, the electric leakage determination threshold, or is less than the electric leakage determination threshold, but the continued time thereof has not exceeded the first determination time than1, the process returns to Start.

That is, if an electric leakage is not occurring in the strong current system 90, insulation resistors 94*a*-94*e* are interposed between the strong current system 90 and the ground side; therefore, insulation is ensured, and the insulation resistance becomes an extremely high value. In contrast, when an electric leakage is occurring, energization that does not interpose one of the insulation resistors 94*a*-94*e* is occurring; therefore, the insulation resistance is greatly reduced. Therefore, the electric leakage determination threshold is set in advance to a value that corresponds to the insulation resistance at the time of an occurrence of such electric leakage.

In addition, when power is being supplied to the motor MG, or the like, in the strong current system 90, the voltage and the current values fluctuate. Therefore, the insulation resistance that is detected by the resistance detection unit 95 also fluctuates due to the influence of such fluctuation of the voltage and current values. Therefore, by waiting for the continuation of the first determination time than1, errant detection due to the influence of such fluctuation is eliminated.

As described above, the determination of step S101 is a determination of a first stage, as to whether or not a leakage is occurring in the strong current system 90. Therefore, a case where a state in which the insulation resistance is less than the electric leakage determination threshold has continued in excess of the first determination time than1, is a first stage electric leakage occurrence detection, and the process after step S102 is a process during an electric leakage determination, and is a process to identify the electric leakage site.

In step S102, to which the process proceeds at the time of an electric leakage occurrence, it is determined that a reduction in the insulation resistance is detected, and a voltage resistance reduction abnormality flag, described later (refer to FIG. 5), is set (ON), after which the process proceeds to step S103. In step S103, it is determined whether or not the electric air conditioner 70 was being operated at the point in time in which an electric leakage occurrence was determined in step S101; if the electric air conditioner was being operated, the process proceeds to step S104, and if not, the process proceeds to step S110.

In step S104, to which the process proceeds if the electric air conditioner 70 was being operated in step S103, a process to determine whether or not the electric leakage site is in the air conditioner region C (refer to FIG. 3) on the electric air conditioner 70 side in the first strong current system 91 is started. That is, the process of step S104-step S108 is a process for determining whether or not the electric leakage site is in the air conditioner region C (refer to FIG. 3) on the electric air conditioner 70 side in the first strong current system 91.

In step S105a, which is subsequent to step S104, it is determined whether or not the current traveling mode is the EV mode; in the case of the EV mode, the process proceeds to step S105b and the engine Eng is started to transition to the HEV mode, while outputting an engine stop prohibition request. In addition, if the current traveling mode is the HEV mode, the process proceeds to step S105b and the HEV mode is maintained, while outputting an engine stop prohibition request.

That is, in steps S105b and S105c, an engine stop prohibition request is output so as to maintain the HEV mode, after which the process proceeds to step S106.

Therefore, until the electric leakage site is specified in steps S109 and S110, described later, transition to the EV mode is prohibited and the HEV mode is maintained by the engine stop prohibition request. At the time of the engine stop prohibition request, the integrated controller 10 sets an engine stop prohibition request flag (refer to FIG. 5 and FIG. 6), and the engine controller 13 prohibits the stopping of the engine Eng while the engine stop prohibition request flag is set. In this case, for example, even if the integrated controller 10 executes a well-known idle stop control, the drive of the engine Eng is not stopped, and the drive state is maintained.

In step S106, to which the process proceeds after maintaining the HEV mode in steps S105b and S105c, a stop request for the electric air conditioner 70 is output, after which the process proceeds to step S107. The integrated controller 10 sets (from OFF to ON) an air conditioner stop request flag (refer to FIG. 5 and FIG. 6), as the stop request for the electric air conditioner 70. In addition, the AC controller 16 receives a stop request by the air conditioner stop request flag and stops the electric air conditioner 70 (the motor 71m of the electric compressor 71), and simultaneously switches an air conditioner operation flag (refer to FIG. 5 and FIG. 6) from operation to inactivation.

In step S107, to which the process proceeds after the electric air conditioner 70 is stopped, it is determined whether or not a state in which the insulation resistance, which is detected by the resistance detection unit 95, is equal to or greater than the electric leakage determination threshold, has continued in excess of a second determination time than2. If a state in which the insulation resistance is equal to or greater than the electric leakage determination threshold has continued in excess of the second determination time than2, the process proceeds to step S109; otherwise (the insulation resistance is less than the electric leakage determination threshold, or the continued time that the insulation resistance is equal to or greater than the electric leakage determination threshold is equal to or less than the second determination time than2), the process proceeds to step S108. The electric leakage determination threshold used in this step S107 may be the same value as in step S101, or a value higher than the value used in step S101. In addition, the second determination time than2 may be the same value as the electric leakage determination time used in step S101, or a different value may be used.

That is, in step S107, it is determined whether or not the electric leakage state determined in step S101 has been eliminated by stopping the electric air conditioner 70. Then, if the electric leakage state has been eliminated by stopping the electric air conditioner 70, the process proceeds to step S109, and it is determined that the electric leakage location is the air conditioner region C. Additionally, in step S109, the engine stop prohibition request that was output in step S105 is stopped. Specifically, the engine stop prohibition request flag is reset (OFF).

On the other hand, in step S108, to which the process proceeds when a state in which the insulation resistance is equal to or greater than the electric leakage determination threshold has not continued in excess of the second determination time than2, it is determined whether or not a preset third determination time than3 (refer to FIG. 6) has elapsed since stopping the electric air conditioner 70. Then, until the third determination time than3 has elapsed, the process returns to step S107 and repeats the process of this step S107. In addition, even if the third determination time than3 has elapsed, if the state in which the insulation resistance is equal to or greater than the electric leakage determination threshold has not continued in excess of the second determination time than2, the process proceeds to step S110. Then, in step S110, it is determined that the electric leakage location is a region other than the air conditioner region C.

Actions of the First Embodiment

Figure 5:
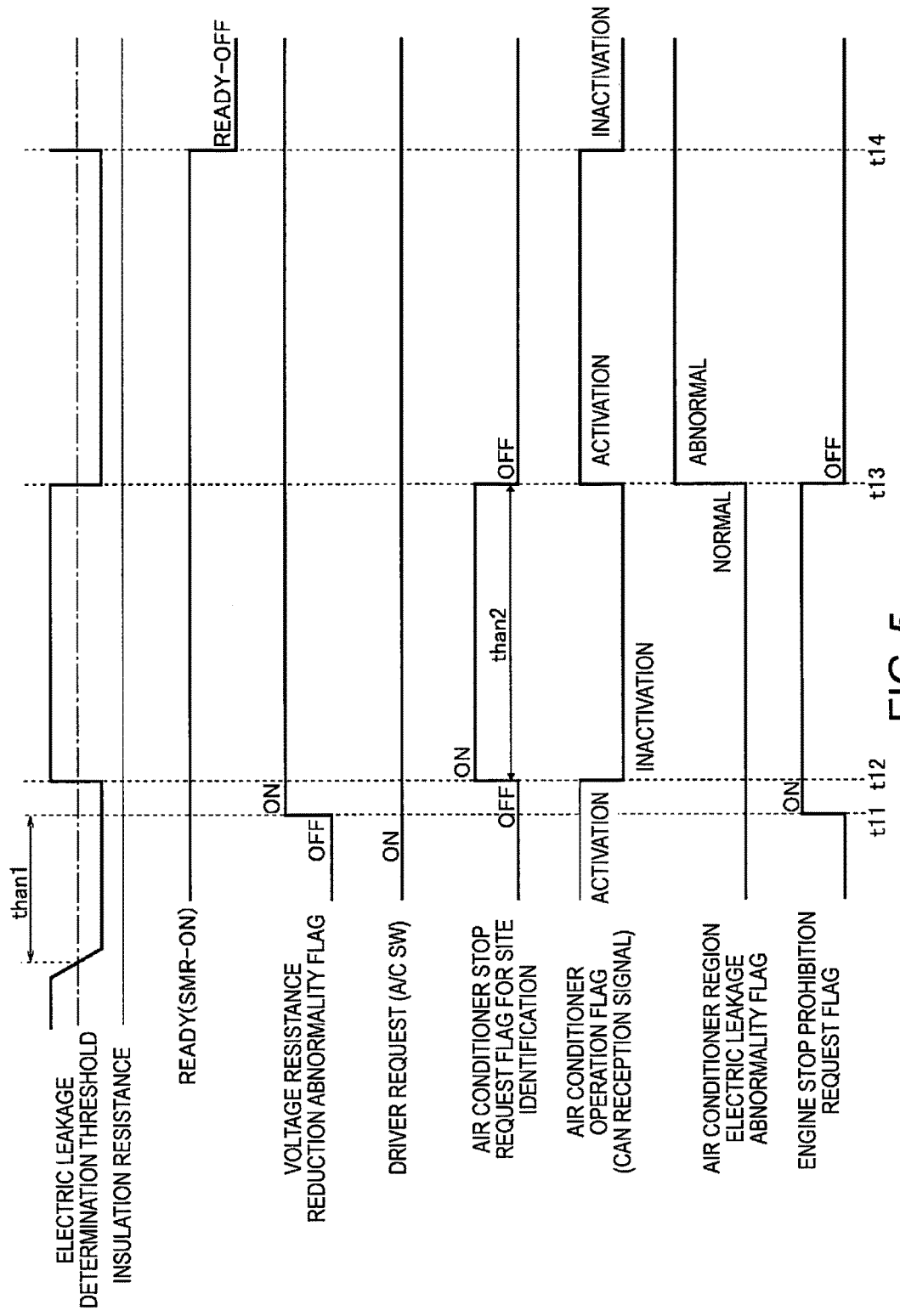
FIG. 5 is a timing chart illustrating the operation when an electric leakage occurs in an air conditioner region in the vehicle control device for hybrid vehicles according to the first embodiment.

Next, the actions of the first embodiment will be described based on the time charts of FIG. 5 and FIG. 6. The operation when an electric leakage occurs in the air conditioner region C will be described, based on the time chart of FIG. 5. In the operation example of FIG. 5 and FIG. 6, the ignition switch, which is not shown, is turned ON, and the driver is depressing an accelerator pedal, which is not shown, and running the vehicle. Therefore, the vehicle is in a travelable READY-ON state, and in a state where the driver requested driving force is being generated (ON).

Then, this operation example shows the operation when an electric leakage occurs at time t11. As a result of this electric leakage occurrence, the insulation resistance detected by the resistance detection unit 95 is reduced, and if a state in which the insulation resistance is less than the electric leakage determination threshold continues in excess of the first determination time than1, the integrated controller 10 detects an insulation resistance decrease (electric leakage detection), and sets a voltage resistance reduction abnormality flag (ON). The process described above is according to step S101→S102.

Furthermore, at the same time as setting the voltage resistance reduction abnormality flag, the integrated controller 10 outputs an engine start request and an engine stop prohibition request at time t11, and sets an engine stop prohibition request flag. The hybrid vehicle is thereby maintained in the HEV mode.

Then, since the electric air conditioner 70 was operating (air conditioner operation flag ON) at time t11 when the electric leakage is detected, the integrated controller 10 sets an air conditioner stop request flag (ON) for specifying the electric leakage site, and stops the electric air conditioner 70 (time t12). The process described above is according to steps S104-S106.

When there is an electric leakage in the air conditioner region C, the electric leakage in the air conditioner region C is temporarily eliminated by stopping the electric air conditioner 70, and the insulation resistance rises above the electric leakage determination threshold; this state continues while the electric air conditioner 70 is stopped.

Therefore, at the point in time where a state in which this insulation resistance is higher than the electric leakage determination threshold has continued in excess of the second determination time than2 (time t13), it is determined to be an electric leakage in the air conditioner region C, and an air conditioner region electric leakage abnormality flag is set (ON) (based on the process of step S107→S109). An engine stop prohibition request flag is reset (OFF) in accordance with the setting of the air conditioner region electric leakage abnormality flag.

In addition, while determining the electric leakage location between time t12 and time t13 described above (while it is being determined whether or not a state in which the insulation resistance is higher than the electric leakage determination threshold has continued in excess of the second determination time than2), the driving mode of the vehicle is maintained in the HEV mode. Accordingly, compared to when carrying out a mode transition, such as starting the engine with the motor MG, the voltage of the strong current system 90 is stabilized, the insulation resistance that is detected by the resistance detection unit 95 is stabilized, and the electric leakage detection accuracy can be maintained high. In addition, the electric leakage location is not immediately determined to be the air conditioner region C when the insulation resistance is higher than the electric leakage determination threshold; rather, the electric leakage location is identified by whether or not such a state is continued in excess of the second determination time than2. Therefore, it is possible to suppress the occurrence of an errant detection due to a temporary fluctuation in the insulation resistance, caused by a fluctuation in the driving state of the motor MG and other devices that use the electric power of the high power battery BAT.

Moreover, if the vehicle is in the EV mode immediately before this determination, the mode is forcibly transitioned to the HEV mode and the switching of the mode is prohibited, in order to maintain the HEV mode.

This is because, if an acceleration request from the driver is received when traveling in the EV mode while an electric leakage is being detected, and the vehicle is switched to the HEV mode in response to the acceleration request, there is the risk that an electric leakage will be erroneously detected, due to a fluctuation in the insulation resistance accompanying the engine start, as described above. Therefore, if the vehicle is transitioned to the HEV mode before detecting an electric leakage in this manner, the vehicle will not be transitioned from the EV mode to the HEV mode even if there is an acceleration request from the drive while an electric leakage is being detected; therefore, it is possible to suppress an erroneous detection.

In addition, by switching to the HEV mode before detecting an electric leakage, it is possible to ensure drive force in both the engine and the motor, so the traveling performance of the vehicle is not sacrificed. Accordingly, in the first embodiment, since switching to the EV mode is prohibited after setting the HEV mode, accuracy of the electric leakage detection can be improved, and driving according to the required driving force of the driver is possible; therefore, a sufficient traveling performance can be ensured. In the time chart of FIG. 5, thereafter, at time t14, the driver turns the ignition switch, which is not shown, OFF, and the integrated controller 10 stops the electric air conditioner 70 and brings the vehicle into a non-travelable READY-OFF state.

Next, the operation when an electric leakage occurs in a region other than the air conditioner region C will be described, based on the time chart of FIG. 6.

Figure 6:
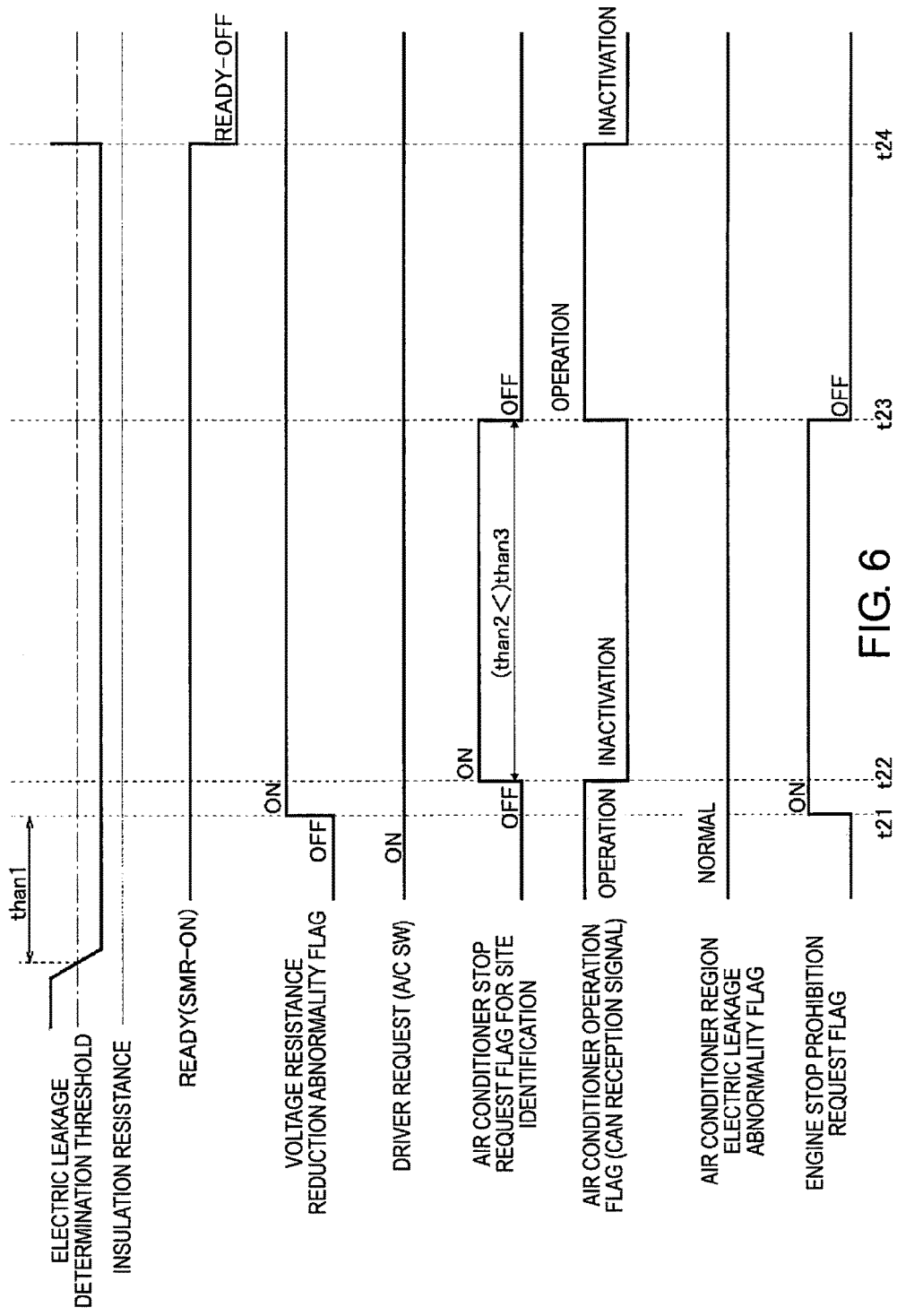
FIG. 6 is a timing chart illustrating the operation when an electric leakage occurs in a region other than the air conditioner region in the vehicle control device for hybrid vehicles according to the first embodiment.

The operation example of FIG. 6 shows the operation when an electric leakage occurs in a region other than the air conditioner region C at time t21. If a state in which the insulation resistance detected by the resistance detection unit 95 falls below the electric leakage determination threshold is continued in excess of the first determination time than1 as a result of this electric leakage occurrence, the integrated controller 10 detects an electric leakage, and sets a voltage resistance reduction abnormality flag (ON) (at time t21). This process is according to step S101→S102.

Then, at the same time as setting the voltage resistance reduction abnormality flag at time t21, the integrated controller 10 sets an engine stop prohibition request flag, and maintains the HEV mode.

Next, the integrated controller 10 sets an air conditioner stop request flag (ON) at time t22, and thereby stops the electric air conditioner 70. The process until stopping the electric air conditioner 70 is based on the process of steps S101-S106, and is the same process as the operation example of FIG. 5.

Next, in the operation example of FIG. 6 in which an electric leakage is occurring in a region other than the air conditioner region C, the electric leakage state is continued and a state in which the insulation resistance is decreased is continued, even when the electric air conditioner 70 is stopped. Therefore, based on the process of steps S107 and S108, a state in which the insulation resistance is lower than the electric leakage determination threshold is maintained, even after the third determination time than1 has elapsed. Accordingly, at time t23 when the elapsed time from the output of a stop request for the electric air conditioner 70 exceeds the third determination time than3, it is determined to be an electric leakage in a region other than the air conditioner region C, and an air conditioner region electric leakage abnormality flag is set (ON) (based on the process of step S108→S109). In addition, an engine stop prohibition request flag is reset (OFF), in response to the setting of this air conditioner region electric leakage abnormality flag. In the time chart of FIG. 6, thereafter, at time t24, the driver turns the ignition switch, which is not shown, OFF, and the integrated controller 10 stops the electric air conditioner 70 and brings the vehicle into a non-travelable READY-OFF state.

As described above, even in the operation example of FIG. 6, the driving mode of the vehicle is maintained in the HEV mode, and switching to the EV mode is prohibited, while the electric leakage location is being determined from time t22 to time t23. Therefore, it is possible to improve the detection accuracy as described above.

Effects of the First Embodiment

The effects of the vehicle control device for hybrid vehicles according to the first embodiment are listed below.

Figure 4:
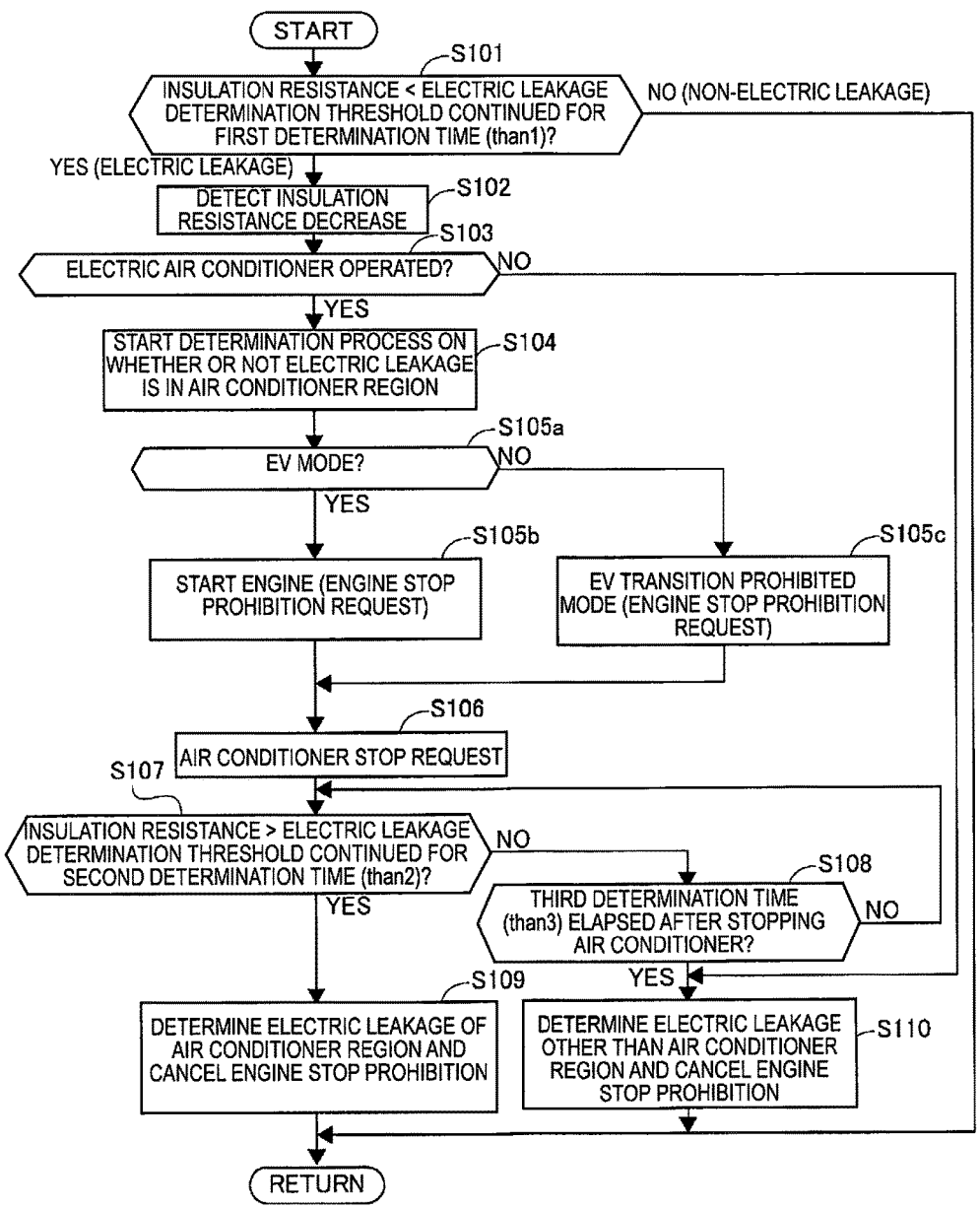
FIG. 4 is a flowchart illustrating the flow of an electric leakage determination process of the vehicle control device for hybrid vehicles according to the first embodiment.

1) The vehicle control device for hybrid vehicles according to the first embodiment comprises: a power source including an engine Eng and a motor MG; a high power battery BAT that supplies power to the motor MG; a portion that executes the process of FIG. 4 in an integrated controller 10, as an electric leakage detection means that detects an occurrence of an electric leakage of a strong current system 90 that is routed from the high power battery BAT to the motor MG; and an integrated controller 10 as a mode controller that prohibits a mode switch between an HEV mode for traveling by the drive force of the engine Eng and the motor MG, and an EV mode for traveling by the drive force of only the motor MG, during an electric leakage detection of the electric leakage detection means. Therefore, it is possible to improve the electric leakage detection accuracy, by suppressing fluctuation of the insulation resistance caused by switching between the HEV mode and the EV mode while an electric leakage detection is being performed, to thereby suppress an erroneous detection of an electric leakage.

2) The vehicle control device for hybrid vehicles according to the first embodiment further comprises an electric air conditioner 70 that adjusts the temperature inside the vehicle by power supplied from the high power battery BAT in the strong current system 90. Therefore, even though an electric air conditioner 70 is further provided to the strong current system 90, and there is a high risk of insulation resistance fluctuation occurring, it is possible to suppress an insulation resistance fluctuation that accompanies a switching of the driving mode of 1) above, and to improve the detection accuracy of an electric leakage.

3) In the vehicle control device for hybrid vehicles according to the first embodiment, the integrated controller 10 as the mode controller sets the HEV mode in advance when an electric leakage occurrence is being determined by the electric leakage detection means, and executes the process of step S105, which prohibits a mode switch. Therefore, while the electric leakage detection accuracy is improved by suppressing fluctuation of the insulation resistance caused by switching between the HEV mode and the EV mode, as described in 1) above, it is possible to output the required driving force without switching the mode during an electric leakage detection, when the required driving force of the driver is large.

4) In the vehicle control device for hybrid vehicles according to the first embodiment, the integrated controller 10, as the electric leakage detection means, carries out the process of step S101, in which an electric leakage occurrence is determined when the insulation resistance falls below the electric leakage determination threshold, which is set in advance, based on a detection of the insulation resistance between the strong current system 90 and the ground. Since the insulation resistance can be relatively easily detected even in the strong current system 90, it is possible to easily determine an electric leakage in the strong current system 90. In addition, in the first embodiment, since an electric leakage is determined when a state in which the insulation resistance falls below the electric leakage determination threshold, which is set in advance, has continued in excess of the first determination time than1, the detection accuracy can be further improved, compared to when an electric leakage is determined from a momentary decrease to below the electric leakage determination threshold.

5) In the vehicle control device for hybrid vehicles according to the first embodiment, an electric air conditioner 70 that adjusts the temperature inside the vehicle by power supplied from the high power battery BAT is further provided to the strong current system 90, and the integrated controller 10 as the electric leakage detection means detects an electric leakage occurrence in the electric air conditioner 70 (S107), when the insulation resistance increases to equal to or greater than the electric leakage determination threshold by stopping the power supply to the electric air conditioner 70 (S106) after detecting an electric leakage occurrence of the strong current system. Therefore, it is possible to detect whether or not the electric leakage location includes the air conditioner region C while detecting the insulation resistance of the entire strong current system 90, simply by stopping the electric air conditioner 70. Furthermore, it thereby becomes possible to improve the fail-safe control performance according to the electric leakage location. For example, if an electric leakage occurs in the electric air conditioner 70, it is possible to permit the activation of the vehicle in a state where the operation of the electric air conditioner 70 is prohibited, at the time of the subsequent activation. In addition, when determining whether or not the electric leakage location is the air conditioner region C, the determination is made after waiting for a state in which the insulation resistance is equal to or greater than the electric leakage determination threshold has continued in excess of the second determination time than2, the detection accuracy can be further improved, compared to when a determination is made from a momentary increase to equal to or greater than the electric leakage determination threshold.

Other Embodiments

Next, the vehicle control device for hybrid vehicles according to other embodiments will be described. Since the other embodiments are modified examples of the first embodiment, configurations common to the first embodiment are given the same reference symbols as the first embodiment and the descriptions thereof are omitted, while describing only the differences from the first embodiment.

Second Embodiment

The vehicle control device for hybrid vehicles according to the second embodiment is a modified example of the first embodiment, in which the electric leakage site is further specified when an electric leakage other than in the air conditioner region C is determined in the process of step S110 in the first embodiment.

That is, the integrated controller 10 determines whether the electric leakage location is in a relay switch upstream region A on the upstream (high power battery BAT) side of the strong current relay switch 93, or in a relay switch downstream region B on the downstream (motor MG) side of the strong current relay switch 93.

Figure 7:
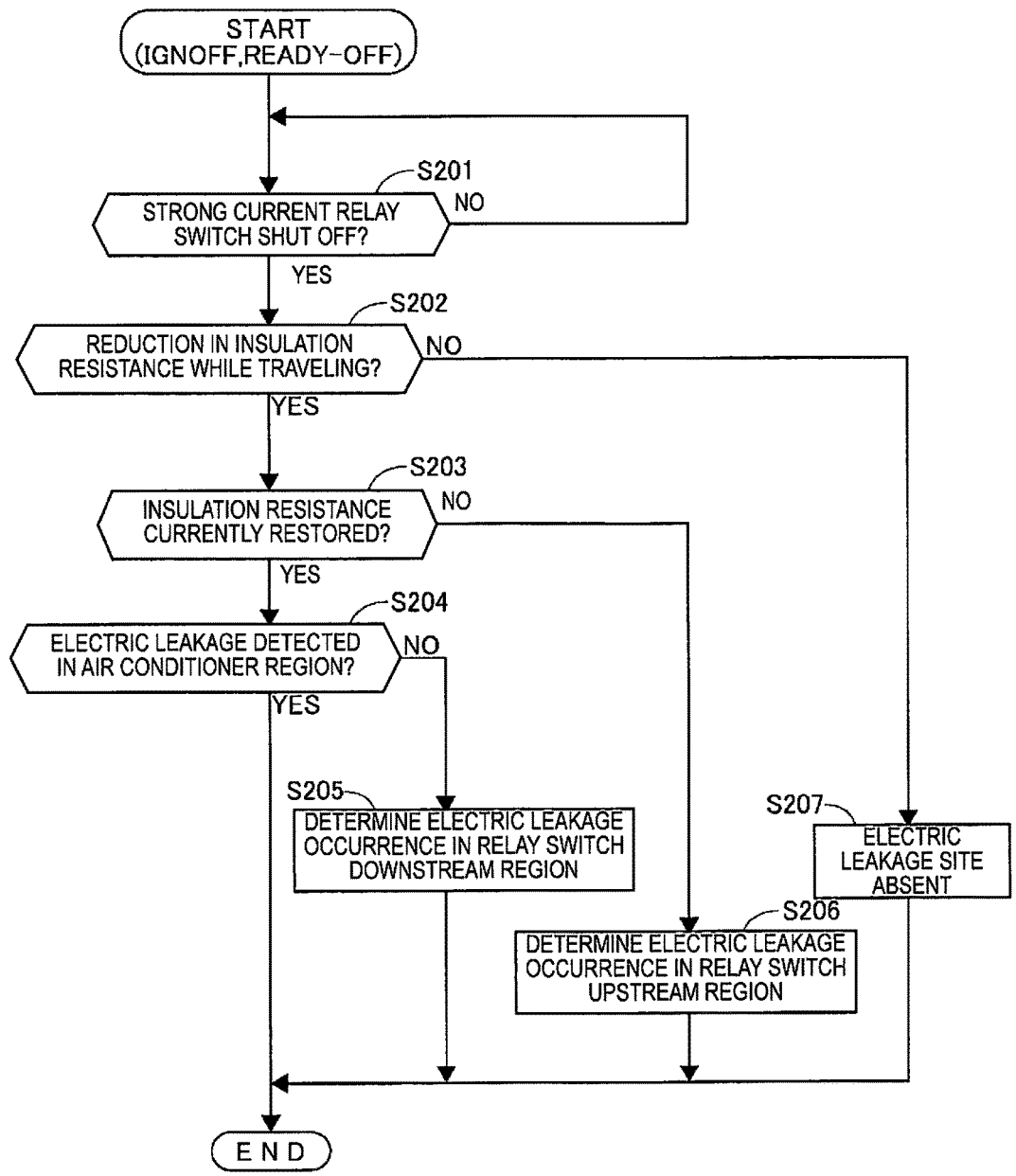
FIG. 7 is a flowchart illustrating the flow of an electric leakage determination process in a relay switch upstream region and a relay switch downstream region, in the vehicle control device for hybrid vehicles according to a second embodiment.

FIG. 7 is a flowchart illustrating the electric leakage determination process between the relay switch upstream region A and the relay switch downstream region B. This process is started at a point in time in which the traveling is ended and the driver turns OFF the ignition switch (IGN), which is not shown, to bring the vehicle into a READY-OFF state.

In step S201, in response to the ignition switch (IGN) being turned OFF, it is determined whether or not a strong current relay switch 93, which connects and disconnects between the high power battery BAT, and the motor MG, as well as the DC/DC converter 80, has been shut off.

In the subsequent step S202, it is determined whether or not there was a decrease in the insulation resistance (electric leakage determination) while traveling, before the ignition switch (IGN), which is not shown, was turned OFF (voltage resistance reduction abnormality flag set). If the insulation resistance is decreased and the voltage resistance reduction abnormality flag is set (S102), the process proceeds to step S203, and if the voltage resistance reduction abnormality flag is not set, the process proceeds to step S207. In this step S207, the process is ended after determining "electric leakage site absent."

In step S203, to which the process proceeds when there is a decrease in the insulation resistance while traveling (electric leakage detection), it is determined whether or not the insulation resistance is currently restored (to at least greater than the electric leakage determination threshold); if restored, the process proceeds to step S204, and if not restored, the process proceeds to step S206. Then, in step S206, it is determined to be an electric leakage in the relay switch upstream region A.

That is, if an electric leakage is occurring in the relay switch upstream region A, the electric leakage state will continue even if the ignition switch (IGN) is turned OFF to shut off the strong current relay switch 93. Therefore, in step S203, if the insulation resistance is restored by shutting off the strong current relay switch 93, after the insulation resistance becomes less than the electric leakage determination threshold while traveling and the voltage resistance reduction abnormality flag is set, it is determined to be an electric leakage in the relay switch upstream region A.

On the other hand, if electric leakage is occurring in one or both of the relay switch downstream region B and the air conditioner region C, the electric leakage is eliminated and the insulation resistance is restored if the strong current relay switch 93 is shut off. Therefore, in this case, if an electric leakage of the air conditioner region C while traveling is not being determined in step S109, it means that an electric leakage is occurring in the relay switch downstream region B.

Therefore, in step S204, to which the process proceeds when the insulation resistance is not restored in step S203, it is determined whether or not there was an electric leakage determination in the air conditioner region C while traveling. If there was an electric leakage determination of the air conditioner region C, the present process is ended, and if an electric leakage determination of the air conditioner region C is absent, the process proceeds to step S205 and it is determined to be an electric leakage in the relay switch downstream region B.

As described above, in the vehicle control device for hybrid vehicles according to the second embodiment, if an electric leakage occurs, it is possible to identify the electric leakage location to be one of the relay switch upstream region A, the relay switch downstream region B, and the air conditioner region C. Therefore, it is also possible to carry out a fail-safe control that corresponds to the site of the electric leakage occurrence. For example, if an electric leakage is occurring only in the air conditioner region C, and an electric leakage is not occurring in the relay switch upstream region A and the relay switch downstream region B, traveling can be permitted by connecting the strong current relay switch 93 after prohibiting the operation of the electric air conditioner 70.

In the second embodiment, if an electric leakage occurs simultaneously in the air conditioner region C and the relay switch downstream region B, it is determined to be YES in the process of step S204 when the ignition switch (IGN) is turned OFF after the electric leakage occurrence. Therefore, it cannot be determined to be an electric leakage in the relay switch downstream region B.

However, by prohibiting the operation of the electric air conditioner 70 when an electric leakage occurrence in the air conditioner region C is determined, or during the subsequent traveling after this electric leakage determination, an electric leakage occurrence in the relay switch downstream region B can be determined when this subsequent traveling is ended.

That is, at the time of this subsequent traveling, since an insulation resistance decrease (electric leakage) is detected by step S101→S102, and the electric air conditioner 70 is stopped, an electric leakage is not determined in the air conditioner region C. Therefore, upon executing the process of FIG. 7 when this subsequent traveling is ended, it is determined to be NO in step S204, and the process proceeds to step S205 to determine an electric leakage occurrence in the relay switch downstream region B.

Effects of the Second Embodiment

The effects of the vehicle control device for hybrid vehicles according to the second embodiment are described below.

2-1) In the vehicle control device for hybrid vehicles according to the second embodiment, a strong current relay switch 93 as a motor connection and disconnection part that connects and disconnects a power supply between the high power battery BAT and the motor MG is further provided in the strong current system 90 between the high power battery BAT and the motor MG; and the integrated controller 10 as the electric leakage detection means detects an electric leakage occurrence in a relay switch downstream region B, which is on the motor MG side of the strong current relay switch 93, when the insulation resistance on the high power battery BAT side of the strong current relay switch 93 increases to be equal to, or greater than, the electric leakage determination threshold, by shutting off the strong current relay switch 93 after detecting an electric leakage occurrence in the strong current system (step S101, S102). Therefore, it is possible to more accurately identify the electric leakage location, and to improve the electric leakage detection performance. In addition, it thereby becomes possible to also improve the fail-safe control performance.

2-2) In the vehicle control device for hybrid vehicles according to the second embodiment, a strong current relay switch 93 as a motor connection and disconnection part that connects and disconnects a power supply between the high power battery BAT and the motor MG is further provided in the strong current system 90 between the high power battery BAT and the motor MG; and the integrated controller 10 as the electric leakage detection means detects an electric leakage occurrence in a relay switch upstream region A, which is on the high power battery BAT side of the strong current relay switch 93 of the strong current system 90, when the insulation resistance on the high power battery BAT side of the strong current relay switch 93 is less than the electric leakage determination threshold, even when the strong current relay switch 93 is shut off after the insulation resistance falls below the electric leakage determination threshold (step S101, S102). Therefore, it is possible to identify the electric leakage location in more detail and to improve the electric leakage detection performance.

Third Embodiment

Figure 8:
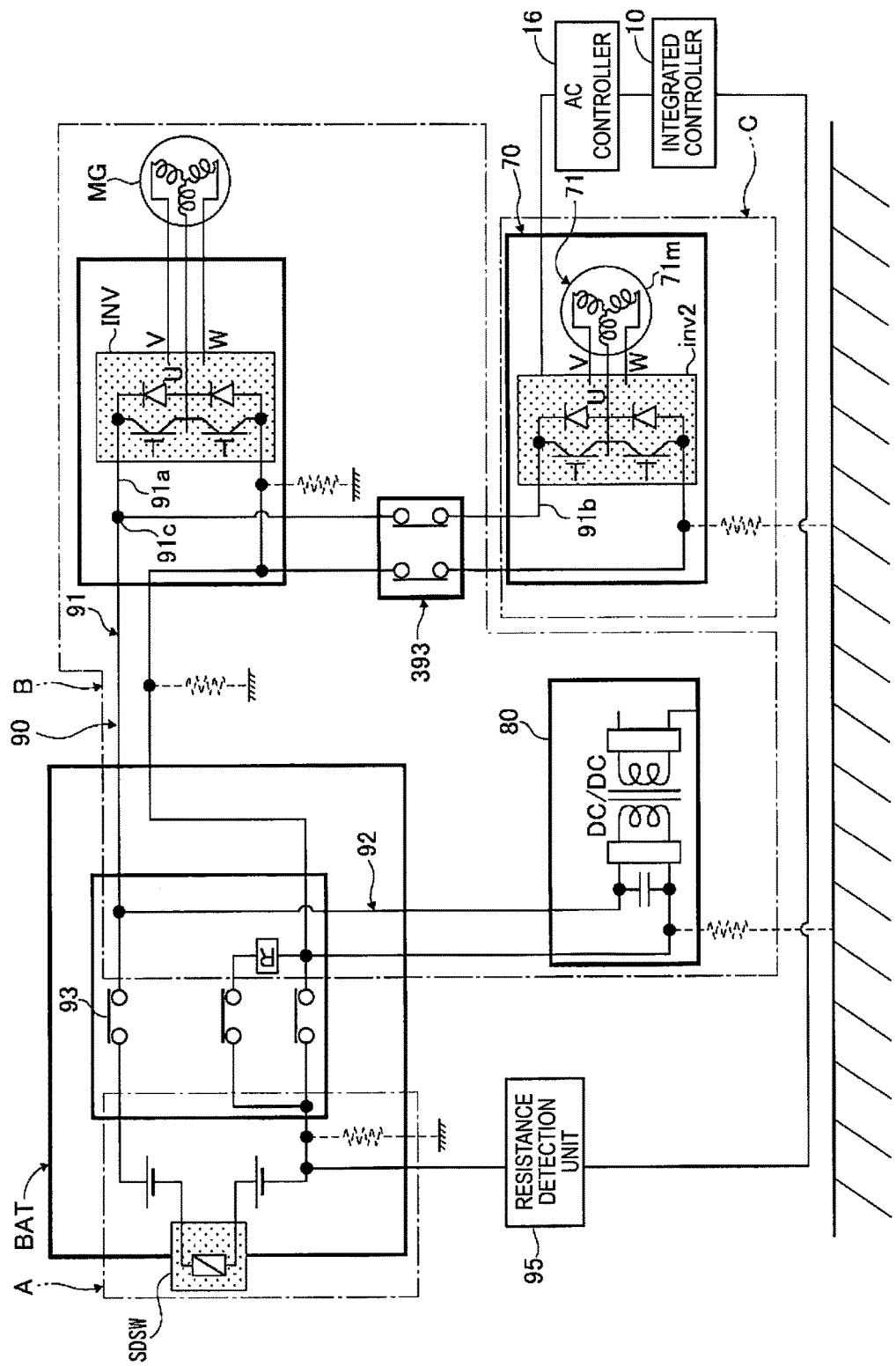
FIG. 8 is a schematic circuit diagram illustrating a strong current system in the vehicle control device for hybrid vehicles according to a third embodiment.

The vehicle control device for hybrid vehicles according to the third embodiment is a modified example of the first embodiment, in which an air conditioner relay switch 393, as an air conditioner connection and disconnection part that connects and disconnects the power supply to the electric air conditioner 70, is provided in the air conditioner branch line part 91b of the strong current system 90, as illustrated in FIG. 8.

In the third embodiment, the air conditioner relay switch 393 is shut off upon a stop request of the electric air conditioner 70 by the process of step S106 in the first embodiment. Then, in the process of step S107, the resistance detection unit 95 detects the insulation resistance on the high power battery BAT side of the air conditioner relay switch 393. At this time, if the insulation resistance on the high power battery BAT side increases to be equal to, or greater than, the electric leakage determination threshold, it is determined to be an electric leakage occurrence on the electric air conditioner 70 side of the air conditioner relay switch 393 of the strong current system 90. Additionally, the operation of the electric air conditioner 70 may be stopped by shutting off the air conditioner relay switch 393, even when an electric leakage determination of the air conditioner region is carried out by the process of step S109.

The vehicle control device for hybrid vehicles according to the third embodiment is described below.

3-1) In the vehicle control device for hybrid vehicles according to the third embodiment, an air conditioner relay switch 393 as an air conditioner connection and disconnection part that connects and disconnects a power supply from the high power battery BAT to the electric air conditioner 70 is further provided in the strong current system 90 between the high power battery BAT and the electric air conditioner 70; and the integrated controller 10 as the electric leakage detection means detects an electric leakage occurrence on the electric air conditioner 70 side of the air conditioner relay switch 393 of the strong current system 90, when the insulation resistance on the high power battery BAT side of the air conditioner relay switch 393 is increased to be equal to, or greater than, the electric leakage determination threshold, by shutting off the air conditioner relay switch 393 after the insulation resistance falls below the electric leakage determination threshold and an electric leakage occurrence of the strong current system is detected. Therefore, in a vehicle equipped with, in addition to the motor MG, an electric air conditioner 70 that is operated by a power supply from the high power battery BAT, an accurate determination of the electric leakage location is required also from a request to execute a fail-safe control with respect to the electric leakage location. In the third embodiment, in a case in which the strong current system 90 supplies power not only to the motor MG, but also, to an electric air conditioner 70, a more highly accurate electric leakage determination becomes possible compared to a case in which simply the presence/absence of an electric leakage is determined, by determining whether the electric leakage location is the air conditioner region C or elsewhere.

Fourth Embodiment

Figure 9:
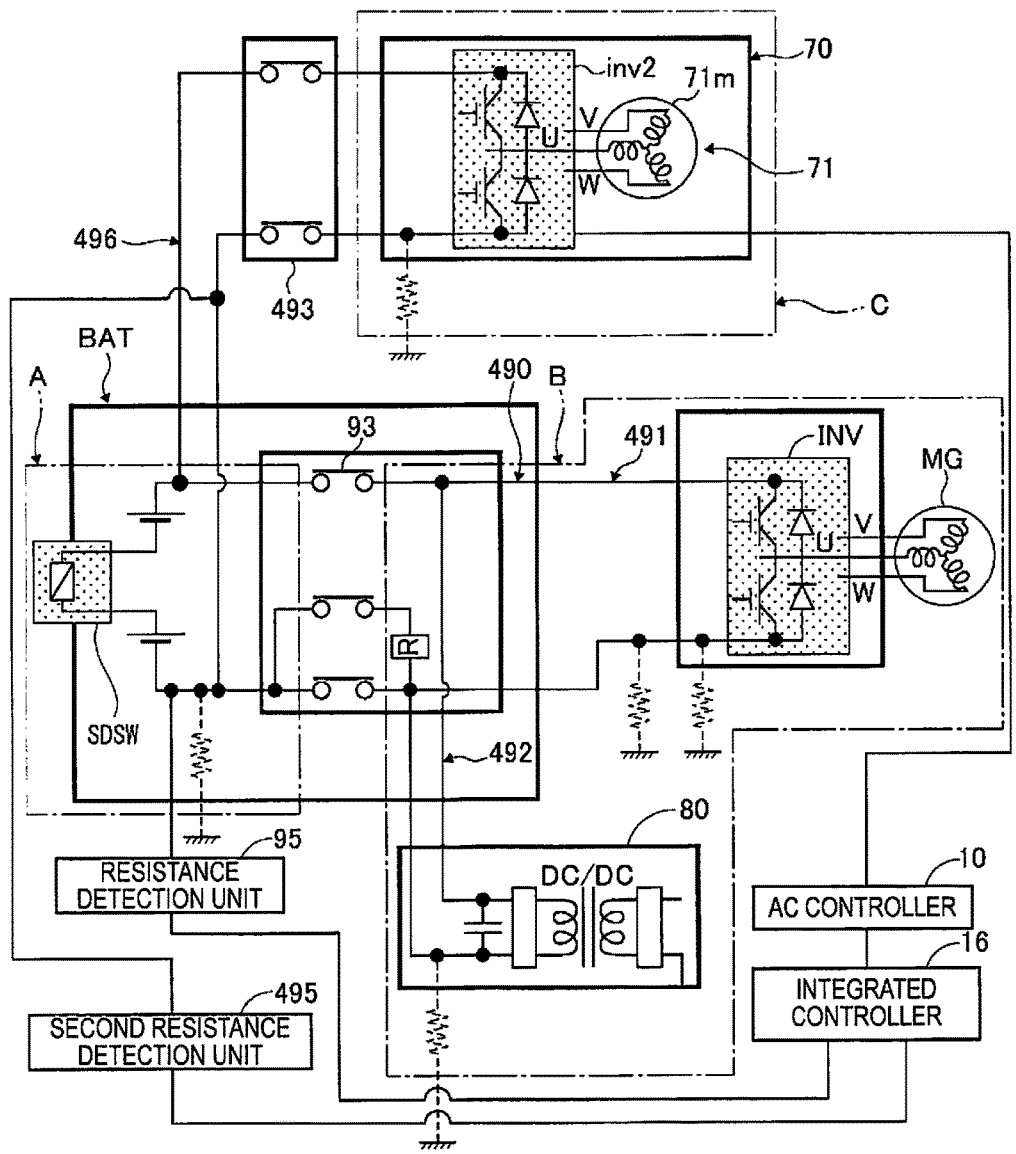
FIG. 9 is a schematic circuit diagram illustrating a strong current system in the vehicle control device for hybrid vehicles according to a fourth embodiment.

The vehicle control device for hybrid vehicles according to the fourth embodiment is a modified example of the first embodiment, in which an air conditioner strong current system 496 that supplies power to an electric air conditioner 70 is provided in the strong current system 490 independent of the power supply to the motor MG. FIG. 9 is a schematic circuit diagram illustrating the strong current system 490 of a hybrid vehicle to which is applied the electrical leakage detection device of the fourth embodiment. This strong current system 490 is provided with a first strong current system 491 that supplies power between the high power battery BAT and the motor MG, and a second strong current system 492 that supplies power between the high power battery BAT and the DC/DC converter 80, on the downstream side of the strong current relay switch 93.

In addition, the strong current system 490 is provided with an air conditioner strong current system 496 that supplies power between the high power battery BAT and the electric air conditioner 70 on the upstream side of the strong current relay switch 93. The air conditioner strong current system 496 is provided with an air conditioner relay switch (air conditioner connection and disconnection part) 493 that connects and disconnects a power supply from the high power battery BAT to the electric air conditioner 70. In the fourth embodiment, the electric air conditioner 70 side of the air conditioner relay switch 493 is the air conditioner region C.

In the fourth embodiment, the electric leakage determination by the insulation resistance in step S101 may also be carried out by a detection of the insulation resistance of the strong current system 490, which includes the air conditioner strong current system 496, by the resistance detection unit 95, in the same manner as the first embodiment. Alternatively, a second resistance detection unit 495 illustrated in FIG. 9 may be provided, and the insulation resistance of the air conditioner strong current system 496 may also be detected by the second resistance detection unit 495. If using the second resistance detection unit 495, an air conditioner electric leakage determination threshold, which is a value corresponding to the insulation resistance of the air conditioner strong current system 496, is used as the electric leakage determination threshold. In addition, if detecting with the resistance detection unit 95 in the same manner as the first embodiment, the air conditioner electric leakage determination threshold that is set according to the fourth embodiment is also used as the electric leakage determination threshold.

In addition, the air conditioner relay switch 493 is shut off at the time of a stop request of the electric air conditioner 70 in step S106 described in the first embodiment. Then, in the subsequent process of step S107, when the insulation resistance is restored to equal to or greater than the electric leakage determination threshold (air conditioner electric leakage determination threshold), it is determined to be an electric leakage occurrence in the air conditioner region C.

Additionally, in the fourth embodiment, when determining the presence/absence of an electric leakage in the relay switch upstream region A, the strong current relay switch 93 and the air conditioner relay switch 493 are cut off in the process of step S201, in the same manner as the second embodiment. At this time, if the insulation resistance is restored, and an electric leakage is absent in the air conditioner region C, it is determined to be an electric leakage in the relay switch downstream region B, which is the motor MG side region. Additionally, if the insulation resistance is not restored, it is determined to be an electric leakage in the relay switch upstream region A.

Effects of the Fourth Embodiment

The effects of the vehicle control device for hybrid vehicles according to the fourth embodiment are listed below.

4-1) In the vehicle control device for hybrid vehicles according to the fourth embodiment, an air conditioner relay switch 493 as an air conditioner connection and disconnection part that connects and disconnects a power supply from the high power battery BAT to the electric air conditioner 70 is further provided in an air conditioner strong current system 496, which is a strong current system 490 between the high power battery BAT and the electric air conditioner 70; and the integrated controller 10 as the electric leakage detection means detects an electric leakage occurrence on the electric air conditioner 70 side of the air conditioner relay switch 493 of the strong current system 490, when the insulation resistance on the high power battery BAT side of the air conditioner relay switch 493 is increased to be equal to, or greater than, the electric leakage determination threshold, by shutting off of the air conditioner relay switch 493 after the insulation resistance falls below the electric leakage determination threshold and an electric leakage occurrence of the strong current system is detected. Therefore, in a vehicle equipped with, in addition to the motor MG, an electric air conditioner 70 that is operated by a power supply from the high power battery BAT, an accurate determination of the electric leakage location is required also from a request to execute a fail-safe control with respect to the electric leakage location. In the fourth embodiment, in a case in which the strong current system 490 supplies power not only to the motor MG, but also to an electric air conditioner 70, a more accurate electric leakage determination becomes possible compared to a case in which simply the presence/absence of an electric leakage is determined, by determining whether the electric leakage location is in the air conditioner region C or elsewhere.

4-2) In the vehicle control device for hybrid vehicles according to the fourth embodiment, an electric air conditioner 70 that adjusts the temperature inside the vehicle by power supplied from the high power battery BAT is provided in the air conditioner strong current system 496, which is directly routed from the high power battery BAT; and the integrated controller 10 as the mode controller prohibits a mode switch while an electric leakage detection means is determining an electric leakage in either a first strong current system 491, which is a strong current system to the motor MG, or the air conditioner strong current system 496. Therefore, it is possible to improve the electric leakage detection accuracy, by suppressing fluctuation of the insulation resistance caused by switching between the HEV mode and the EV mode while an electric leakage detection is being performed, to thereby suppress an erroneous detection of an electric leakage.

4-3) In the vehicle control device for hybrid vehicles according to the fourth embodiment, an integrated controller 10 is provided as an air conditioner electric leakage detection means that detects an occurrence of an electric leakage in the air conditioner strong current system 496 (air conditioner region C), when the insulation resistance between the air conditioner strong current system 496 and the ground falls below the electric leakage determination threshold, which is set in advance. Therefore, in a case in which an air conditioner strong current system 496 that is different from the first strong current system 491, which is a strong current system that is connected to the motor MG, is provided, an electric leakage in the air conditioner strong current system 496 can be easily detected by detecting the insulation resistance of the air conditioner strong current system 496.

4-4) In the vehicle control device for hybrid vehicles according to the fourth embodiment, an air conditioner relay switch 493 as an air conditioner connection and disconnection part that connects and disconnects a power supply from the high power battery BAT to the electric air conditioner 70 is further provided in the air conditioner strong current system 496, and the integrated controller 10 as an air conditioner electric leakage detection means detects an electric leakage occurrence in the air conditioner region C, which is on the electric air conditioner 70 side of the air conditioner relay switch 493 of the air conditioner strong current system 496, when the insulation resistance on the high power battery BAT side of the air conditioner relay switch 493 is increased to be equal to, or greater than, the air conditioner electric leakage determination threshold, by shutting off the air conditioner relay switch 493 after the insulation resistance falls below the air conditioner electric leakage determination threshold. Therefore, it is possible to detect an electric leakage on the electric air conditioner 70 side, even in a vehicle equipped with, in addition to a first strong current system 491, which supplies power to the motor MG, an electric air conditioner 70 that is operated by a power supply from the high power battery BAT by the air conditioner strong current system 496. By accurately detecting the electric leakage location in this manner, it also becomes possible to execute a fail-safe control that corresponds to the electric leakage location.

4-5) In the vehicle control device for hybrid vehicles according to the fourth embodiment, a strong current relay switch 93, as a motor connection and disconnection part that connects and disconnects a power supply from the high power battery BAT, is further provided in the first strong current system 491, which is a strong current system between the high power battery BAT and the motor MG; and the integrated controller 10, as an electric leakage detection means, detects an electric leakage occurrence in the relay switch downstream region B, which is on the motor MG side of the strong current relay switch 93 of the strong current system 490, when the insulation resistance is increased to be equal to, or greater than, a strong current system electric leakage determination threshold, by shutting off the strong current relay switch 93 after the insulation resistance falls below the strong current system electric leakage determination threshold. Therefore, the electric leakage site can be accurately identified by a simple configuration comprising a detection of the insulation resistance and switching of the strong current relay switch 93. In addition, since it is possible to identify the electric leakage site in this manner, a fail-safe control that corresponds to the electric leakage site becomes possible. For example, a fail-safe control, in which the driving of the motor MG is prohibited when there is an electric leakage on the motor MG side, becomes possible.

The vehicle control device for hybrid vehicles of the present invention was described above based on the embodiments, but specific configurations thereof are not limited to these embodiments, and various modifications and additions to the design can be made without departing from the scope of the invention according to each claim in the claims.

For example, in the embodiments, an example of a hybrid vehicle provided with a first clutch as a drive force connection and disconnection means, which connects and disconnects the transmission of the drive force between the engine and motor, was shown; however, the invention is not limited to such a configuration. That is, it is possible to use a configuration in which it is possible to transition between the EV mode and the HEV mode without connecting/disconnecting the drive force in this manner. Alternatively, even when providing a driving force connection and disconnection means, it is possible to use other means, such as planetary gearing, in addition to using the clutch as shown in the drawings. In addition, in the embodiments, a motor-generator that is capable of powering and regeneration was shown as the motor, but no limitation is imposed thereby, and a motor that is only capable of powering may be used as well. In addition, in the embodiments, examples were shown in which a continuously variable transmission is used as the transmission; however, the transmission is not limited to a continuously variable transmission, and other manual or automatic transmission may be used as well.

Additionally, in the embodiment, a motor connection and disconnection part is commonly used for connecting/disconnecting power supply to the DC/DC converter in addition to connecting/disconnecting power supply to the electric air conditioner, but no limitation is imposed thereby. For example, the configuration may be provided with a relay switch that respectively connects and disconnects the power supply to the motor, the DC/DC converter, and the electric air conditioner, independently. In this case, by connecting/disconnecting each switch independently at the time of an electric leakage occurrence, it is possible to identify an electric leakage in each of the strong current systems.

The invention claimed is:

1. A hybrid vehicle control device for hybrid vehicles comprising:
   a power source including an engine and a motor;
   a high power battery that supplies power to the motor; and
   a controller configured to perform electric leakage detection to detect an occurrence of an electric leakage of a strong current system that is routed from the high power battery to the motor; and
   the controller being further configured to prohibit a mode switch between a hybrid electric vehicle (HEV) mode for traveling by a drive force of the engine and the motor, and an electric vehicle (EV) mode for traveling by the drive force of only the motor when an occurrence of an electric leakage is being detected.

2. The hybrid vehicle control device according to claim 1, wherein
   the controller sets the HEV mode in advance during the electric leakage detection, and prohibits the mode switch.

3. The hybrid vehicle control device according to claim 1, wherein
   the controller is configured to detect an electric leakage occurrence when insulation resistance falls below an electric leakage determination threshold, which is set in advance, based on a detection of the insulation resistance between the strong current system and a ground.

4. The hybrid vehicle control device according to claim 3, further comprising
   an electric air conditioner disposed in the strong current system, and that is configured to adjust a vehicle interior temperature by power supplied from the high power battery in the strong current system; and
   the electric leakage detection means detects an electric leakage occurrence in the electric air conditioner when the insulation resistance increases to be equal to, or greater than, the electric leakage determination threshold, by stopping the power supply to the electric air conditioner after detecting the electric leakage occurrence of the strong current system.

5. The hybrid vehicle control device according to claim 4, further comprising
   an air conditioner connection and disconnection part disposed in the strong current system between the high power battery and the electric air conditioner, and that is configured to connect and disconnect a power supply from the high power battery to the electric air conditioner; and
   the controller is configured to detect an electric leakage occurrence on an electric air conditioner side of the air conditioner connection and disconnection part, when the insulation resistance on the high power battery side of the air conditioner connection and disconnection part increases to be equal to, or greater than, the electric leakage determination threshold, by shutting off the air conditioner connection and disconnection part after detecting the electric leakage occurrence of the strong current system.

6. The hybrid vehicle control device according to claim 3, further comprising
   a motor connection and disconnection part disposed in the strong current system between the high power battery and the motor, and that is configured to connect and disconnect a power supply between the high power battery and the motor; and
   the controller is configured to detect an electric leakage occurrence on a motor side of the motor connection and disconnection part when the insulation resistance on a high power battery side of the motor connection and disconnection part increases to be equal to, or greater than, the electric leakage determination threshold, by shutting off the motor connection and disconnection part after detecting the electric leakage occurrence of the strong current system.

7. The hybrid vehicle control device according to claim 1, further comprising
   an electric air conditioner disposed in an air conditioner strong current system, which is directly routed from the high power battery, and that is configured to adjust a vehicle interior temperature; and
   the controller is configured to prohibit the mode switch while detecting an electric leakage occurrence in one of the strong current system and the air conditioner strong current system.

8. The hybrid vehicle control device according to claim 7, wherein
   the controller is configured to detect an occurrence of an electric leakage in the air conditioner strong current system when the insulation resistance between the air conditioner strong current system and a ground falls below an electric leakage determination threshold, which is set in advance.

9. The hybrid vehicle control device according to claim 8, further comprising
   an air conditioner connection and disconnection part disposed in the air conditioner strong current system, and that is configured to connect and disconnect a power supply from the high power battery to the electric air conditioner; and
   the controller is configured to detect an electric leakage occurrence on an electric air conditioner side of the air conditioner connection and disconnection part, when the insulation resistance on a high power battery side of the air conditioner connection and disconnection part increases to be equal to, or greater than, the electric leakage determination threshold, by shutting off the air conditioner connection and disconnection part after the insulation resistance falls below an air conditioner electric leakage determination threshold.

10. The hybrid vehicle control device according to claim 7, further comprising
    a motor connection and disconnection part disposed in the strong current system between the high power battery and the motor, and that is configured to connect and disconnect a power supply from the high power battery; and the controller is configured to detect an electric leakage occurrence on a motor side of the motor connection and disconnection part, when the insulation resistance on a high power battery side of the motor connection and disconnection part increases to be equal to, or greater than, a strong current system electric leakage determination threshold, by shutting off the motor connection and disconnection part after the insulation resistance falls below the strong current system electric leakage determination threshold.

* * * * *